United States Patent
Wang et al.

(10) Patent No.: US 7,250,341 B2
(45) Date of Patent: Jul. 31, 2007

(54) FLASH MEMORY DEVICE HAVING POLY SPACERS

(75) Inventors: Hsingya Arthur Wang, San Jose, CA (US); Kai-Cheng Chou, San Jose, CA (US); Peter Rabkin, Cupertino, CA (US)

(73) Assignee: Hynix Semiconductor Inc., Ichon-Si (KR)

( * ) Notice: Subject to any disclaimer, the term of this patent is extended or adjusted under 35 U.S.C. 154(b) by 0 days.

(21) Appl. No.: 11/100,123

(22) Filed: Apr. 5, 2005

(65) Prior Publication Data

US 2005/0186739 A1    Aug. 25, 2005

Related U.S. Application Data

(62) Division of application No. 10/431,172, filed on May 6, 2003, now Pat. No. 6,911,370.

(60) Provisional application No. 60/383,470, filed on May 24, 2002.

(51) Int. Cl.
*H01L 21/336* (2006.01)
*H01L 29/788* (2006.01)

(52) U.S. Cl. ..................... 438/267; 257/315
(58) Field of Classification Search ........ 257/314–316; 438/241, 257, 267, 287
See application file for complete search history.

(56) References Cited

U.S. PATENT DOCUMENTS

| 5,674,768 | A | 10/1997 | Chang et al. |
| 5,943,261 | A | 8/1999 | Lee |
| 6,372,617 | B1 * | 4/2002 | Kitamura ................ 438/593 |
| 6,436,767 | B1 * | 8/2002 | Koishikawa ............ 438/265 |
| 6,642,570 | B2 | 11/2003 | Tseng |

\* cited by examiner

*Primary Examiner*—Calvin Lee
(74) *Attorney, Agent, or Firm*—Townsend & Townsend & Crew LLP

(57) ABSTRACT

A non-volatile memory device includes a substrate having a first active region and a second active region. A first floating gate is provided over the first active region and having an edge, the first floating gate being made of a conductive material. A first spacer is connected to the edge of the first floating gate and being made of the same conductive material as that of the first floating gate. A control gate is provided proximate to the floating gate.

12 Claims, 4 Drawing Sheets

(a) P1 film deposition (e) blanket poly layer etch (f) Barrier layer removal, leaving poly spacer

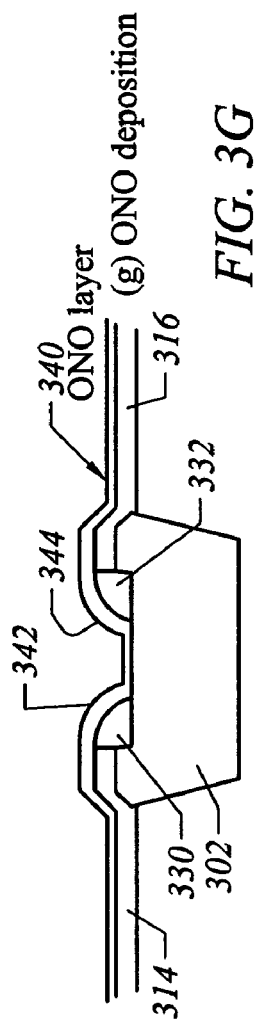
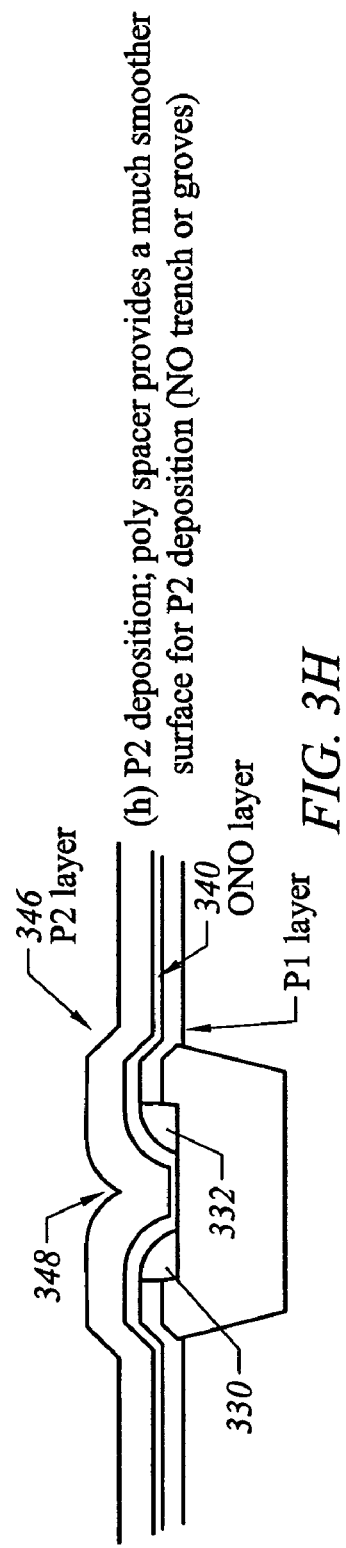
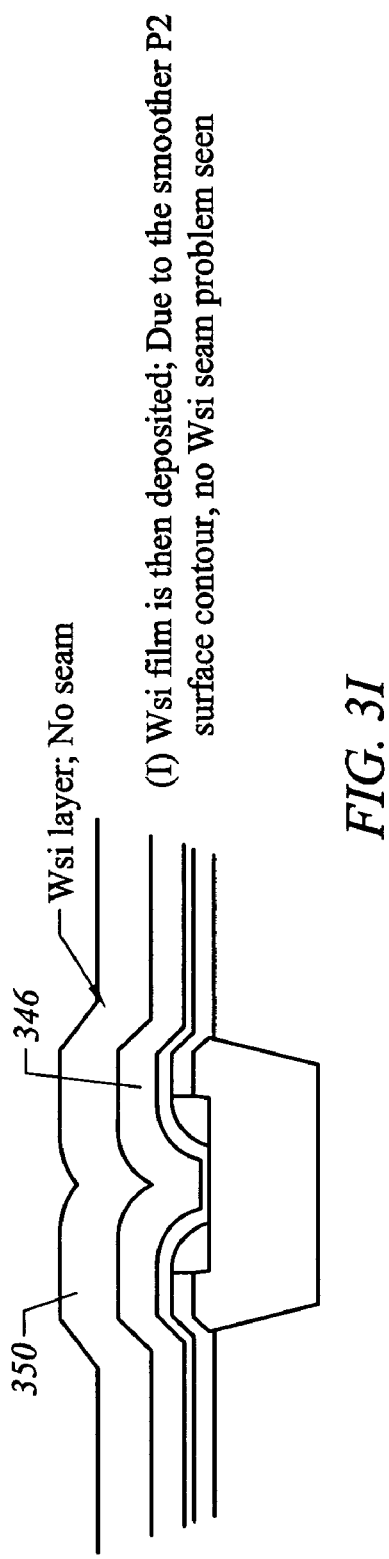

FLASH MEMORY DEVICE HAVING POLY SPACERS

CROSS-REFERENCES TO RELATED APPLICATIONS

This application is a division of U.S. application Ser. No. 10/431,172, filed on May 6, 2003 and issued as U.S. Pat. No. 6,911,370, which claims priority to U.S. Provisional Patent Application No. 60/383,470, filed on May 24, 2002, which disclosures are incorporated by reference.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to integrated circuit nonvolatile memories, and in particular to flash memories. Flash memories are electrically erasable nonvolatile memories in which groups of cells can be erased in a single operation.

Numerous types of integrated circuit memory are now well known, as are processes for manufacturing them. One particular type of integrated circuit memory is nonvolatile memory. Nonvolatile memory is referred to as such because it does not lose the information stored in the memory when power is removed from the memory. Nonvolatile memory has many applications in products where the supply of electricity is interruptable. For example, one well known product employing flash memory is PCMCIA or PC cards. PC cards are small credit card-sized packages that contain nonvolatile memory within which a computer program or other information is stored. Such devices allow the user to connect and disconnect the memory card from a computer or other electronic apparatus, without losing the program stored within the memory card.

Nonvolatile memory devices include read only memories (ROM), programmable read only memories (PROM), electrically erasable read only memories (EEPROM), as well as other types. Within the field of electrically erasable programmable memories, a certain class of devices is known as flash memory, or flash EEPROMs. Such memories are selectively programmable and erasable, typically with groups of cells being erasable in a single operation.

In conventional flash memories, each memory cell is formed from a transistor having a source, drain, control gate and floating gate. The floating gate is formed between the control gate and the substrate. The presence, or absence, of charge trapped on the floating gate can be used to indicate the contents of the memory cell. Charge trapped on the floating gate changes the threshold voltage of the transistor, enabling detection of its binary condition.

In most flash memories, charge is placed on, or removed from, the floating gate by operating the memory at conditions outside its normal operating conditions for reading its contents. For example, by adjusting the relative potentials between the gate and the source, drain or channel regions, charge, in the form of electrons, can be caused to be injected onto the floating gate, or removed from the floating gate.

BRIEF SUMMARY OF THE INVENTION

According to one embodiment of the present invention, a non-volatile memory device includes a substrate having a first active region and a second active region. A first floating gate is provided over the first active region and having an edge, the first floating gate being made of a conductive material. A first spacer is connected to the edge of the first floating gate and being made of the same conductive material as that of the first floating gate. A control gate is provided proximate to the floating gate.

In another embodiment, a flash memory device includes a substrate having a first active region and a second active region. A field trench oxide separates the first and second active regions. A floating gate is provided over the first active region and having an edge, the first floating gate being made of polysilicon. A spacer is coupled to the edge of the floating gate and being made of polysilicon, the spacer having a slope less than about 60 degrees. A control gate overlies the floating gate. A metal layer is provided over the control gate, wherein the spacer reduces formation of a void in the metal layer.

In another embodiment, a method of fabricating a non-volatile memory device includes forming a polysilicon floating gate over a substrate, the floating gate having an edge; forming a polysilicon spacer joined to the edge of the floating gate, the spacer having a sloping edge having a slope less than 60 degrees; and forming a polysilicon control gate over the floating gate and the spacer.

In another embodiment, a non-volatile memory device includes a substrate having a first active region and a second active region; an isolation structure separating the first and second active regions; a first floating gate provided over the first active region and having a first edge, the first floating gate being made of a conductive material; a first spacer connected to the first edge of the first floating gate and having a first sloping edge, the first spacer being of a conductive material and overlying the isolation structure; and a control gate provided proximate to the floating gate. The first sloping edge of the first spacer forms an angle of less than 65 degrees to facilitate deposition of material over the first spacer and the isolation structure. The device further includes a second floating gate provided over the second active region and having a second edge, the second floating gate being of the same conductive material as the first floating gate; a second spacer connected to the second edge of the second floating gate and having a second sloping edge, the second spacer being of a conductive material and overlying the isolation structure and electrically isolation from the first spacer; a metal layer overlying the first and second floating gates and the isolation structure, wherein each of the first and second sloping edges forms an angle of less than 65 degrees, so that a portion of the metal layer overlying the isolation structure is substantially free of a void. The metal layer includes tungsten or aluminum.

In yet another embodiment, a method for fabricating a non-volatile memory device includes forming a first polysilicon layer over an isolation structure and first and second regions of a substrate, the first and second regions being defined by the isolation structure; forming a dielectric layer overlying the first polysilicon layer; etching the first polysilicon layer and the dielectric layer to expose a portion of the isolation structure, the etching step defining a first edge associated with the first region and a second edge associated with the second region; forming a second polysilicon layer over the exposed portion of the isolation structure, the second polysilicon layer contacting the first and second edges; etching the second polysilicon layer to form a first spacer joined to the first edge and a second spacer joined to the second edge; forming an interpoly dielectric layer overlying the first and second spacers and the first polysilicon layer; forming a third polysilicon layer overlying the interpoly dielectric layer; and forming a metal layer over lying the third polysilicon layer.

BRIEF DESCRIPTION OF THE DRAWINGS

FIGS. 3A-3I illustrate a method of fabricating a control gate and a tungsten silicide without a void or seam therein according to one embodiment of the present invention.

DETAILED DESCRIPTION OF THE INVENTION

Figure 1:
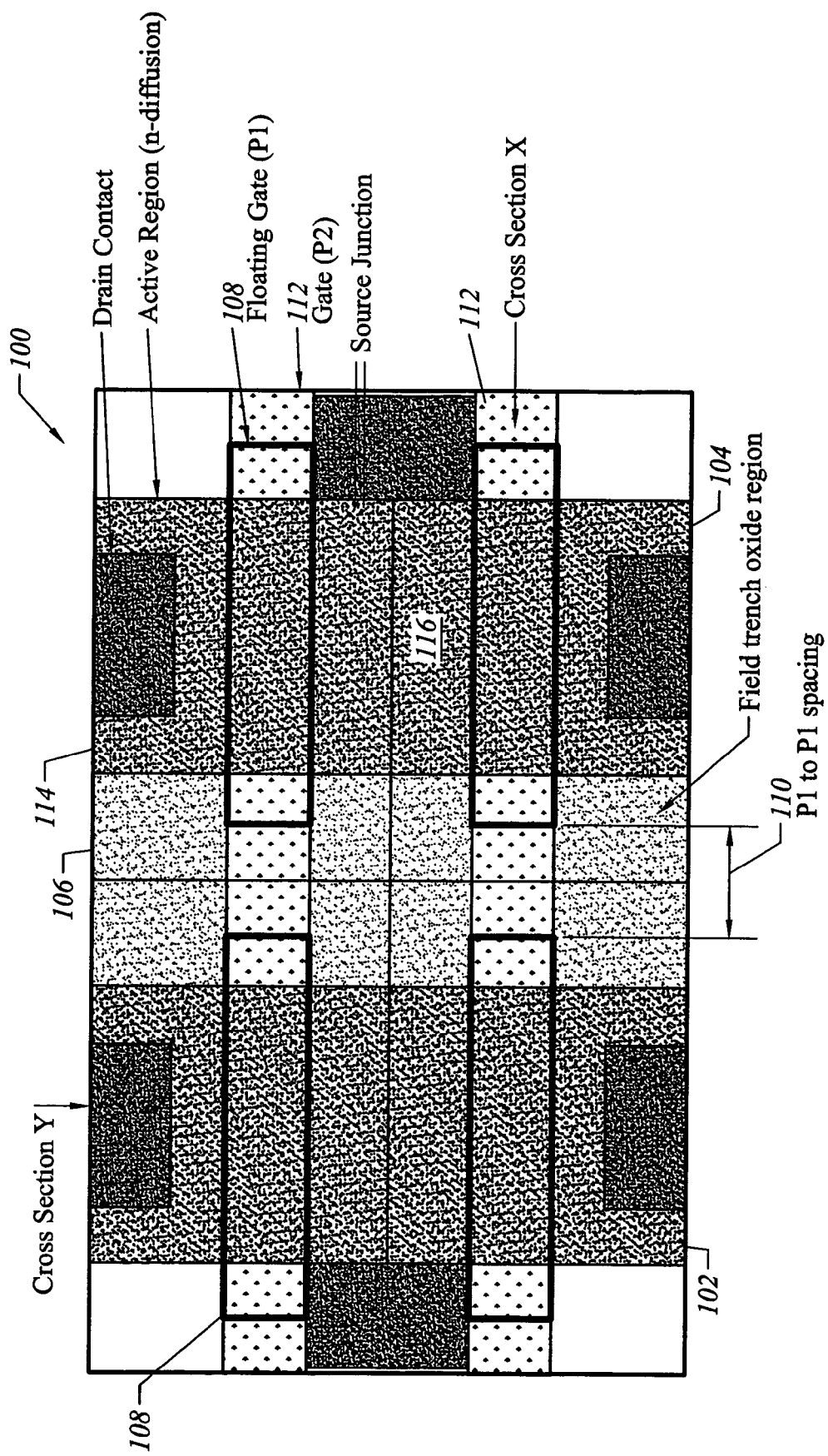
FIG. 1 illustrates a schematic top view of a flash memory device.

FIG. 1 illustrates a schematic top view of a flash memory device 100. The device 100 includes a plurality of active regions 102 and 104 separated by a field trench oxide region 106. A plurality of floating gates 108 is provided overlying the active regions 102 and 104. The floating gates are generally formed using polysilicon and commonly referred to as a "poly 1 layer" or "P1." The floating gates generally extend over the field trench oxide region 106 to define a P1-to-P1 spacing 110 that is less than the width of the field trench oxide region 106. A plurality of control gates 112 is provided over the floating gates. The control gates are generally formed using polysilicon and also referred to as a "poly 2 layer" or "P2." A drain region 114 is provided at one side of the floating gate. A source region 116 is provided at the other side of the floating gate.

FIGS. 2A-2E illustrate a conventional process flow of forming a metal layer, e.g., a tungsten silicide layer, overlying a control gate. A void or seam may be formed within the metal layer due to step coverage problem, described below, which is undesirable since the void would increase the sheet resistance of the metal layer.

Figure 2A:
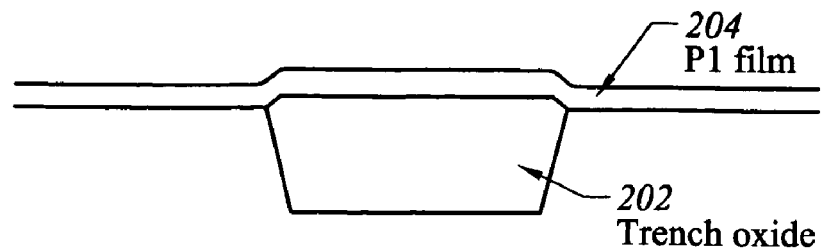
FIGS. 2A-2E illustrate a conventional method of fabricating a control gate and a tungsten silicide thereon.
Figure 2B:
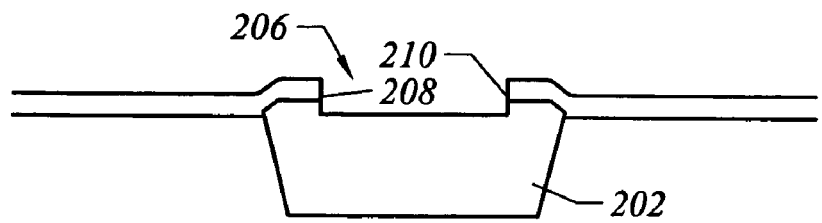
Figure 2C:
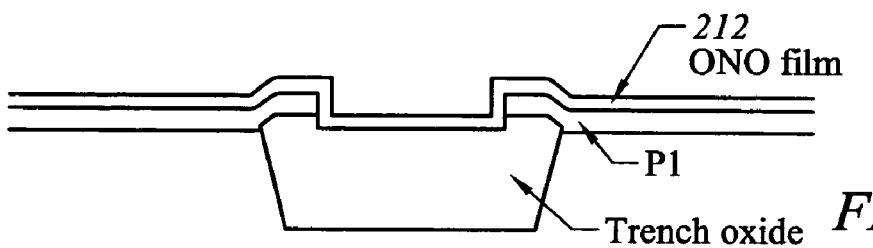

A field trench oxide 202 is formed to electrically isolate adjacent active regions (FIG. 2A). A first polysilicon layer 204 having a thickness of about 500-1,000 Å is deposited on the trench oxide 202. The first polysilicon layer 204 is etched to define a floating gate (FIG. 2B. Along with the unwanted portions of the first polysilicon layer, a portion of the trench oxide 202 is etched to form a groove 206. The groove 206 defines edges 208 and 210. The unetched portion of the first polysilicon layer 204 defines the floating gate. An interpoly dielectric layer 212 is then formed over the first polysilicon layer and the substrate (FIG. 2C). The layer 212 is often called the interpoly dielectric film since it is sandwiched between the first polysilicon layer and another polysilicon layer which defines the control gate for each cell, as will be explained later.

Figure 2D:
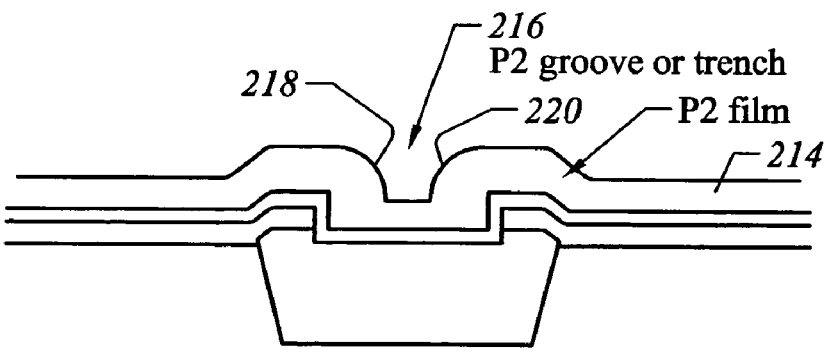

Referring to FIG. 2D, after the formation of the interpoly dielectric layer 212, a second polysilicon layer 214 having a thickness of about 1000-2000 Å is deposited over the dielectric layer and the substrate using one of many techniques. Due to the conformal nature of the polysilicon deposition, the second polysilicon layer is unable to fill the groove 206. Accordingly, a P2 groove 216 having edges 218 and 220 is formed after the deposition of the second polysilicon layer. The edges 218 and 220 are relatively high because each successive layer formed over the groove 206 adds to the height.

Figure 2E:
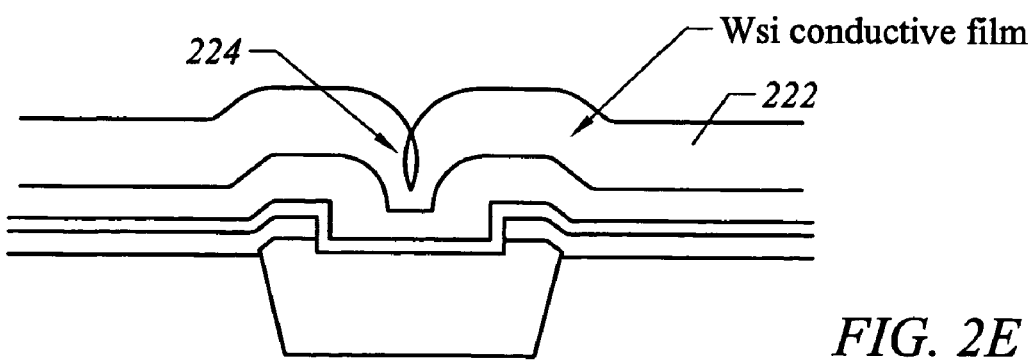

A metal layer 222, e.g., a tungsten silicide (Wsi), is deposited over the second polysilicon layer (FIG. 2E). As a result of the relatively high edges 218 and 220, a void or seam 224 may be formed within the tungsten silicide provided between the edges 218 and 220. The void 224 decreases the conductivity of the tungsten silicide that is undesirable since it may reduce the operational speed of the device.

FIGS. 3A-3I illustrate a process flow of forming a metal layer, e.g., a tungsten silicide layer, overlying a control gate according to one embodiment of the present invention. The process flow described reduces formation of a void or seam within the metal layer and improves the coupling coefficient of the floating gate.

Figure 3A:
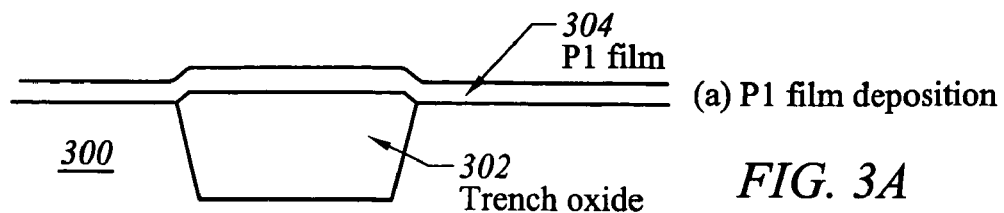

A field trench oxide 302 is formed on a substrate 300 to electrically isolate adjacent active regions (FIG. 3A). Although the figure shows a single trench oxide, numerous trench oxides are formed simultaneously on the substrate. The substrate is a silicon substrate, preferably of 8-10 ohm centimeter resistivity, and of crystal orientation <100>. A first polysilicon layer 304 having a thickness of about 500-1,000 Å is deposited on the trench oxide 302. Generally, the first polysilicon layer is deposited using a low pressure chemical vapor deposition ("LPCVD") process and is lightly doped. The methods used to dope the first polysilicon include diffusion doping, in-situ doping, and ion implantation doping techniques. The polysilicon layer is doped with n-type dopants to a concentration level of about $1\times10^{19}$ dopants per cubic centimeter.

Figure 3B:
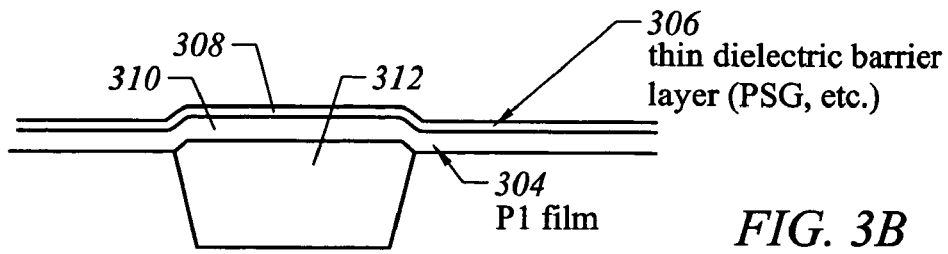

A dielectric layer 306 is formed over the first polysilicon layer 304 (FIG. 3B). The dielectric layer 306 is relatively thin, e.g., about 500 Å or less. The dielectric layer may be PSG or other suitable materials.

Figure 3C:
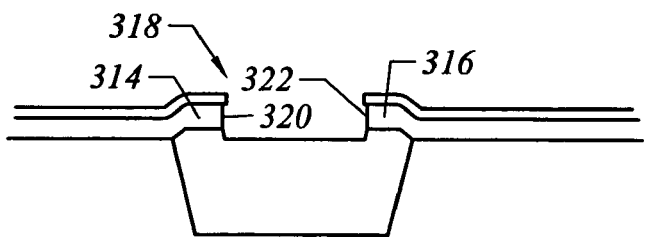

Thereafter, the dielectric layer 306 and the first polysilicon layer 304 are etched, preferably in a single etch step (FIG. 3C). The etch step includes forming a masking layer (not shown) over the dielectric layer and the first polysilicon layer, patterning the mask layer to expose an unwanted portion 308 of the dielectric layer that is overlying the trench oxide 302. The exposed portion 308 of the dielectric layer 306 and a portion 310 of the first polysilicon layer underlying the exposed dielectric layer are removed using a dry etch method such as a reactive ion etching process ("RIE") using a plasma ignited from a gas mixture of HBr and $O_2$ or HBr, $Cl_2$ and $O_2$.

Along with the unwanted portions 308 and 310, a portion 312 of the trench oxide 302 is etched as well in an over etch since a precise etch control is difficult (FIG. 3C). Generally, a slight over etch is desired to ensure electrical isolation between two portions 314 and 316 of the polysilicon layer 304 defined by the etch step. These portions of the polysilicon layer 304 define floating gates for the adjacent flash memory transistors or cells. A groove 318 is formed on the trench oxide 302 as a result of the over etch. The groove and the polysilicon portions 314 and 316 together define edges 320 and 322 that are substantially vertical or have relatively high slopes since the etch step used to removed the unwanted portions generally is an anisotropic etch.

Figure 3D:
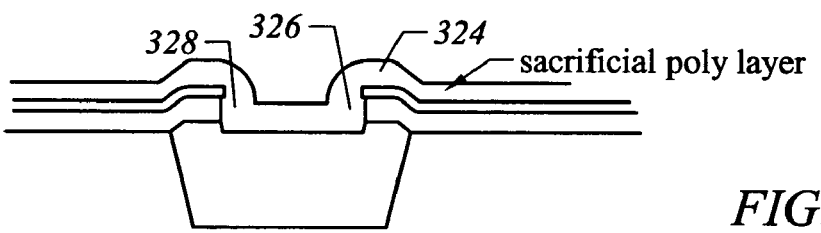
Figure 3E:
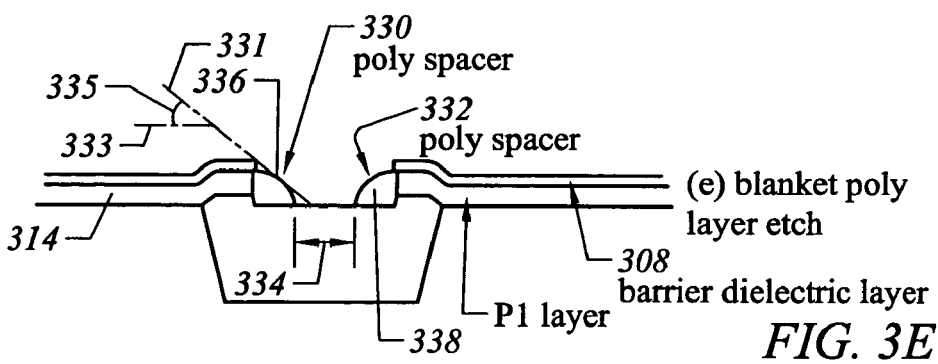

Referring to FIG. 3D, a sacrificial or second polysilicon layer 324 is deposited over the dielectric layer 306, the groove 318, and edges 320 and 322 to form polysilicon spacers (see FIG. 3E). The polysilicon layer 324 is deposited using a low pressure chemical vapor deposition ("LPCVD")

process. Due to the conformal nature of the polysilicon deposition, portions 326 and 328 of the sacrificial layer 324 are contacting the edges of the first polysilicon layer 306. The sacrificial layer is lightly doped. The methods used to dope the first polysilicon include diffusion doping, in-situ doping, and ion implantation doping techniques. The sacrificial polysilicon layer is doped with n-type dopants to a concentration level of about $1\times10^{19}$ dopants per cubic centimeter. The doping level of the layer 324 is substantially similar to that of the first polysilicon layer 304 since the layer 324 will be used to form spacers for the floating gates. Alternatively, the different doping levels may be used for the sacrificial layer. In one implementation, the layer 324 has a thickness of about 300-1,000 Å. Alternatively, the layer 324 may be greater or lesser in thickness according the thickness of spacers desired.

Polysilicon or poly spacers 330 and 332 are formed by blanketly etching away the sacrificial polysilicon layer 324 (FIG. 3E). The poly spacers 330 and 332 are electrically coupled to the floating gates 314 and 316, respectively. A separation 334 is provided between the two poly spacers 330 and 332, so that the electrical isolation of the floating gates 314 and 316 is maintained. The spacers 330 and 332 have sloping edges 336 and 338 that is substantially less than 90 degrees. In one implementation, the slopes of the edges 336 and 338 are about 70 degrees or less, 65 degrees or less, 60 degrees or less, 50 degrees or less, 40 degrees or less, or 30 degrees or less. The etch step used to remove the sacrificial polysilicon layer may be controlled to obtain different slopes for the poly spacers, as desired for different applications. For example, the gas composition and/or bias power (when RIE is used) can be adjusted for control the slope of the spacers. The angle of the sloping edge is defined by a plane 333 that is substantially parallel to the upper surface of the substrate 300 and a line 331 that is tangent to the sloping edge 336 or 338, i.e., an angle 335.

Figure 3F:
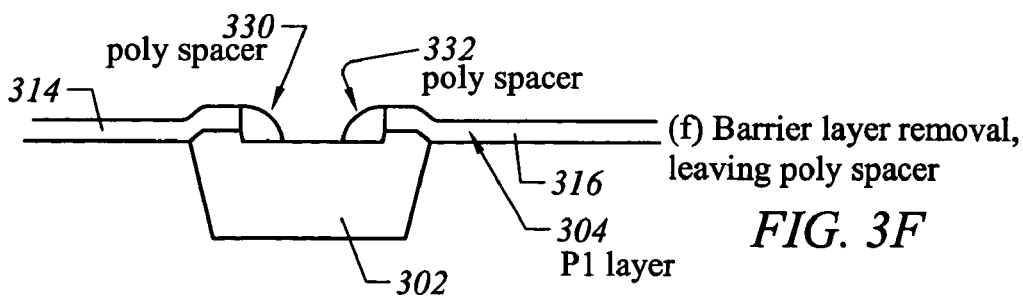

Thereafter, the dielectric layer 308 is removed (FIG. 3F). An interpoly dielectric layer 340 is then formed over the first polysilicon layer 304, the spacers 330 and 332, and the trench oxide 302 (FIG. 3G). The layer 340 is often called the interpoly dielectric film since it is sandwiched between the first polysilicon layer and another polysilicon layer which defines the control gate for each cell, as will be explained later. The interpoly dielectric layer can be a silicon oxide or an ONO layer having a thickness of about 150-400 Å, where the ONO layer has oxide, nitride, and oxide layers stacked in sequence. As a result of the underlying spacers, the ONO layer 340 is also provided with sloping edges 342 and 344 since the layer 340 are deposited conformally. In implementation, the slopes of the edges 342 and 344 are about 70 degrees or less, 60 degrees or less, 50 degrees or less, 40 degrees or less, or 30 degrees or less.

Referring to FIG. 3H, a third polysilicon layer 346 having a thickness of about 700-2000 Å, generally about 1000 Å, is deposited over the dielectric layer to form a control gate. Generally, the third polysilicon layer is deposited using a LPCVD process and is heavily doped in contrast to the first polysilicon layer. The methods used to dope the third polysilicon layer include diffusion doping, in-situ doping, and ion implantation doping techniques. In one embodiment, the polysilicon layer 346 is doped with n-type dopants to a concentration level of about $1\times10^{21}$ dopants per cubic centimeter or to another concentration level suitable for a control gate. As a result of the sloping ONO layer 340 and the spacers 330 and 332, the polysilicon layer 346 is provided with smoother surface than otherwise possible. For example, a groove 348 provided on the polysilicon layer 346 between the spacers 330 and 332 has substantially less depth than the groove 216 (FIG. 2D) formed under the conventional method.

A metal layer 350, e.g., a tungsten silicide (Wsi), is deposited over the third polysilicon layer (FIG. 2E). The metal layer is free of a void or seam unlike in the conventional method due to the relatively smooth surface of third polysilicon layer, thereby providing a higher conductivity for the metal layer.

While the above is a full description of the specific embodiments, various modifications, alternative constructions and equivalents may be used. For example, specific dimensions discussed above are for the specific embodiments. These dimensions may depend on the particular application. Therefore, the above description and illustrations should not be taken as limiting the scope of the present invention which is defined by the appended claims.

What is claimed is:

1. A method of fabricating a non-volatile memory device, the method comprising:
   forming a first gate structure over a substrate, the first gate structuring comprising a given conductive material and having an edge;
   forming a conductive spacer directly contacting the edge of the first gate structure and electrically coupling the first gate structure; and
   forming a second gate structure over the first gate structure and the spacer wherein the method further includes:
   forming a dielectric layer over a first conductive layer and a second conductive layer that are subsequently converted to the first gate structure and the conductive spacer, respectively, and
   forming a third conductive layer over the dielectric layer, the third conductive layer subsequently being converted to the second gate structure.

2. The method of claim 1, wherein the conductive spacer has a sloping edge having a slope less than 60 degrees.

3. The method of claim 1, wherein the conductive spacer and the first gate structure comprise the same material.

4. The method of claim 1, wherein the first gate structure is a floating gate, and the second gate structure is a control gate.

5. The method of claim 4, wherein the first gate structure includes polysilicon, and the conductive spacer includes polysilicon.

6. A method of fabricating a non-volatile memory device, the method comprising:
   forming a polysilicon floating gate over a substrate, the floating gate having an edge;
   forming a polysilicon spacer joined to the edge of the floating gate and electrically coupled to the floating gate, the spacer having a sloping edge having a slope less than 60 degrees; and
   forming a polysilicon control gate over the floating gate and the spacer wherein the method further includes:
   forming an interpoly dielectric layer over a first polysilicon layer and a second polysilicon layer that are subsequently converted to the polysilicon floating gate and the polysilicon spacer, respectively, and
   forming a third polysilicon layer over the interpoly dielectric layer, the third polysilicon layer subsequently being converted to the polysilicon control gate.

7. The method of claim 6, further comprising:
   forming a tungsten silicon layer over the control gate and the spacer.

8. The method of claim 6, wherein the device is a flash memory.

9. The method of claim 6, wherein the floating gate, spacer, and control gates are formed from three different polysilicon layers.

10. The method of claim 6, wherein the spacer has a slope of less than about 50 degrees.

11. The method of claim 6, further comprising:
forming a dielectric layer over the floating gate that is removed after the spacer has been formed.

12. A method for fabricating a non-volatile memory device, the method comprising:
forming a first polysilicon layer over an isolation structure and first and second regions of a substrate, the first and second regions being defined by the isolation structure;
forming a dielectric layer overlying the first polysilicon layer;
etching the first polysilicon layer and the dielectric layer to expose a portion of the isolation structure, the etching step defining a first edge associated with the first region and a second edge associated with the second region;
forming a second polysilicon layer over the exposed portion of the isolation structure, the second polysilicon layer contacting the first and second edges and being electrically coupled to the second polysilicon layer;
etching the second polysilicon layer to form a first spacer joined to the first edge and a second spacer joined to the second edge;
forming an interpoly dielectric layer overlying the first and second spacers and the first polysilicon layer;
forming a third polysilicon layer overlying the interpoly dielectric layer; and
forming a metal layer over lying the third polysilicon layer.

* * * * *